United States Patent
Wang

(10) Patent No.: US 8,917,493 B2
(45) Date of Patent: Dec. 23, 2014

(54) POWER DISTRIBUTION DEVICE AND SERVER RACK SYSTEM USING THE SAME

(75) Inventor: Shi-Feng Wang, Shanghai (CN)

(73) Assignee: Inventec Corporation, Taipei (TW)

( * ) Notice: Subject to any disclaimer, the term of this patent is extended or adjusted under 35 U.S.C. 154(b) by 351 days.

(21) Appl. No.: 13/399,342

(22) Filed: Feb. 17, 2012

(65) Prior Publication Data

US 2013/0067248 A1 Mar. 14, 2013

(30) Foreign Application Priority Data

Sep. 8, 2011 (CN) .......................... 2011 1 0267869

(51) Int. Cl.
*G06F 1/26* (2006.01)
*G06F 1/18* (2006.01)
*H05K 7/14* (2006.01)

(52) U.S. Cl.
CPC .............. *G06F 1/189* (2013.01); *H05K 7/1492* (2013.01)
USPC ..... 361/601; 312/223.2; 174/70 B; 174/99 B; 174/149 B; 174/68.2; 174/520; 439/65; 439/212

(58) Field of Classification Search
USPC ............ 361/601, 611, 679.02, 679.5, 679.47, 361/679.31, 679.4, 679.48; 312/223.2, 312/223.3; 174/70 B, 88 B, 99 B, 72 B, 133 B, 174/149 B, 250, 520, 260, 68.1, 68.2; 439/65, 215, 212, 213
See application file for complete search history.

(56) References Cited

U.S. PATENT DOCUMENTS

| | | | |
|---|---|---|---|
| 4,323,949 A * | 4/1982 | Guritz et al. ................ | 361/827 |
| 5,363,280 A * | 11/1994 | Chobot et al. ............... | 361/794 |
| 6,301,095 B1 * | 10/2001 | Laughlin et al. ............. | 361/624 |
| 6,927,974 B2 * | 8/2005 | Robillard et al. ........... | 361/679.4 |
| 7,102,887 B2 * | 9/2006 | Blackwell .................... | 361/695 |
| 7,425,685 B1 * | 9/2008 | Gundogan et al. ........... | 174/520 |

(Continued)

FOREIGN PATENT DOCUMENTS

| | | | | |
|---|---|---|---|---|
| JP | 2001359230 A | * | 12/2001 | .............. H02G 5/02 |
| TW | 201111949 A | | 4/2011 | |

OTHER PUBLICATIONS

English Translation of the Desaki, Koichi JP 2001359230 A, dated Dec. 2001, translated on Feb. 19, 2014.*

(Continued)

*Primary Examiner* — Hung S Bui
*Assistant Examiner* — Michael Matey
(74) *Attorney, Agent, or Firm* — CKC & Partners Co., Ltd.

(57) ABSTRACT

A power distribution device and a server rack system are provided. The server rack system includes a rack and at least one apparatus disposed therein. The power distribution device distributes electrical power to the apparatus. The power supply device includes a first conducting plate, an insulation layer and a second conducting plate that are sequentially superimposed, and a first and a second power columns inserted in the first and the second plates. The insulation layer is disposed between the first and the second conducting plates. The first and the second power columns are connected to a power supply unit in the rack to obtain electric power therefrom. Each output pin pair includes a first and a second output pins inserted in the first and the second conducting plates. The output pin pairs are connected to the apparatus in the rack to transfer electric power to the apparatus.

12 Claims, 8 Drawing Sheets

(56) References Cited

U.S. PATENT DOCUMENTS

| | | | |
|---|---|---|---|
| 7,808,775 B2 * | 10/2010 | Cherney et al. | 361/624 |
| 8,174,821 B2 * | 5/2012 | Fontana et al. | 361/601 |
| 8,625,748 B2 * | 1/2014 | Kioski et al. | 379/32.01 |
| 2003/0081386 A1 * | 5/2003 | Robillard et al. | 361/724 |
| 2005/0286218 A1 * | 12/2005 | Kim | 361/686 |
| 2006/0007638 A1 * | 1/2006 | Fujiyama et al. | 361/502 |
| 2007/0081308 A1 * | 4/2007 | Ishida | 361/724 |
| 2011/0078346 A1 * | 3/2011 | O'Connor et al. | 710/63 |
| 2012/0200979 A1 * | 8/2012 | Miller et al. | 361/119 |
| 2012/0262864 A1 * | 10/2012 | Wang et al. | 361/679.4 |
| 2012/0327591 A1 * | 12/2012 | Jau et al. | 361/679.48 |
| 2013/0135805 A1 * | 5/2013 | Wang | 361/679.02 |

OTHER PUBLICATIONS

Please see attached NPL document "http://elcodis.com/parts/2955370/42819-3232.html".*

* cited by examiner

US 8,917,493 B2

POWER DISTRIBUTION DEVICE AND SERVER RACK SYSTEM USING THE SAME

CROSS-REFERENCE TO RELATED APPLICATION

This application claims the priority benefit of China application serial no. 201110267869.9, filed Sep. 8, 2011. The entirety of the above-mentioned patent application is hereby incorporated by reference herein and made a part of this specification.

BACKGROUND OF THE INVENTION

1. Field of the Invention

The present invention generally relates to a power distribution or transmission device, in particular, to a power distribution device used in a server rack system.

2. Description of Related Art

A server is a core computer serving the other computers in a network system, which may provide functions such as a magnetic disk and a print service required by a network user, and may also enable clients to share resources in a network environment with each other. The basic architecture of the server is generally the same as a common personal computer, and is formed of components such as a Central Processing Unit (CPU), a memory and an Input/Output (I/O) apparatus, which are connected by a bus therein. The CPU is connected to the memory through a north bridge chip, and the I/O apparatus is connected through a south bridge chip. The server has experienced about three evolution processes according to the structure of a chassis: from an early tower chassis to a rack mode emphasizing centralized performance, and then to a blade server with a high-density computation approach.

Here, a rack server is taken as an example. The rack server is a server with an appearance designed according to a unified standard and used in cooperation with a cabinet. The rack server may be regarded as a tower server with an optimized structure, and is designed mainly to reduce the space occupation of the server as much as possible. Many professional network apparatuses use the rack structure in a flat type mostly, just like a drawer, such as an exchanger, a router, or a hardware firewall. The width of the rack server is 19 inches, and the height thereof uses U as a unit (1 U=1.75 inches=44.45 millimeters). Generally, 1U, 2U, 3U, 4U, 5U and 7U servers exist.

Generally speaking, server units (for example, the exchanger, the router and the hardware firewall) located in the rack are connected to a power supply through cables, and are uniformly powered by the power supply. However, in such a configuration, additional space is needed for placing the cables in the rack and to facilitate movement of the cables with the chassis when withdrawing the server units. This reduces the utilization efficiency of the rack. Moreover, as the number of server units increases, the number of cables also increases, making assembly and service of the server units more complex, error prone, and time consuming.

SUMMARY OF THE INVENTION

Accordingly, the present invention is directed to a power distribution device and a server rack system using the same, which can conveniently and effectively enable a power supply unit to transfer electric power between the apparatuses in the rack.

An embodiment of the present invention provides a power distribution device applicable to a server rack system. The server rack system includes a rack and at least one apparatus disposed therein. The power distribution device is used for distributing electric power to the apparatus. The power distribution device includes a first conducting plate, an insulation layer and a second conducting plate that are sequentially superimposed, and a first power column inserted in the first conducting plate, a second power column inserted in the second conducting plate, and a plurality of output pin pairs. The insulation layer is disposed between the first conducting plate and the second conducting plate. The first power column and the second power column are connected to a power supply unit in the rack to obtain electric power therefrom. Each output pin pair includes a first output pin inserted in the first conducting plate and a second output pin inserted in the second conducting plate. The output pin pair is connected to the apparatus in the rack to transfer electric power to the apparatus.

An embodiment of the present invention provides a server rack system, which includes a rack, a power distribution module support base and a power distribution module. The rack includes a plurality of shelving spaces. The shelving spaces are used for receiving a power supply unit and at least one server unit inserted in a sliding manner along a horizontal axis. The power distribution module support base is disposed between a top portion and a bottom portion of the rack along a vertical axis. The power distribution module is superimposed on a surface of the power distribution module support base along the vertical axis, so as to transfer electric power between the power supply unit and the server unit. The power distribution module includes a first conducting plate, an insulation layer and a second conducting plate that are sequentially superimposed on the base, in which the insulation layer is disposed between the first conducting plate and the second conducting plate. The power distribution module further includes a first power column inserted in the first conducting plate and a second power column inserted in the second conducting plate. The first power column and the second power column are connected to the power supply unit in the rack to obtain electric power therefrom. The power distribution module further includes a plurality of output pin pairs. Each output pin pair includes a first output pin inserted in the first conducting plate and a second output pin inserted in the second conducting plate. The output pin pair is connected to the server unit in the rack to transfer electric power to the server unit.

In an embodiment of the present invention, a first output pin of one of the output pin pairs passes through the insulation layer and the second conducting plate, and protrudes out of the second conducting plate in the same direction with a second output pin of the output pin pair, wherein a ring-shaped insulator surrounding the first output pin is disposed in the second conducting plate. The ring-shaped insulator is used for isolating the first output pin from the second conducting plate.

In an embodiment of the present invention, a power distribution module support base is further included. A surface of the first conducting plate opposite to the insulation layer is superimposed on the power distribution module support base, and the power distribution module support base is disposed between a top portion and a bottom portion of the rack along a vertical axis.

In an embodiment of the present invention, multiple sets of positioning posts are disposed on the power distribution module support base. Each set of the positioning posts is disposed matching the output pin pair protruding from the first conducting plate and the second conducting plate. When the set of the positioning posts is correspondingly inserted in a set of positioning holes on the apparatus, the output pin pair is respectively electrically connected to a pair of electrodes of the apparatus to transfer electric power to the apparatus.

In an embodiment of the present invention, each set of the positioning posts includes two positioning posts. The two positioning posts are respectively disposed on two opposite sides of the first output pin and the second output pin of one of the output pin pairs, wherein the set of the positioning posts, and the first output pin and the second output pin of the output pin pair protrude in the same direction along a horizontal axis of the rack, and distal ends of the set of the positioning posts protrude farther than from distal ends of the output pin pair.

In an embodiment of the present invention, a plurality of fan pin pairs is further included. Each fan pin pair includes a first fan pin inserted in the first conducting plate and a second fan pin inserted in the second conducting plate. The fan pin pair is connected to a fan unit in the rack to transfer electric power to the fan unit. The first fan pin and the second fan pin of each fan pin pair both protrude in a direction opposite to the first output pin and the second output pin of each output pin pair.

In an embodiment of the present invention, at least one set of the positioning posts and a corresponding output pin pair is disposed for each shelving space in the rack.

In an embodiment of the present invention, a fan wall disposed on a back wall of the rack and formed by a plurality of fan units is further included. The base and the power distribution module are disposed between the fan wall and the shelving space, in which the output pin pair protrudes towards the shelving space.

In an embodiment of the present invention, an upper half portion of the base is superimposed with an upper power distribution module, and a lower half portion thereof is superimposed with a lower power distribution module. The upper power distribution module and the lower power distribution module are independently disposed, and are both superimposed on the same surface of the base along the vertical axis.

In an embodiment of the present invention, a first power column and a second power column of the upper power distribution module are respectively disposed on the same end of the first conducting plate and the second conducting plate, a first power column and a second power column of the lower power distribution module are respectively disposed on the same end of the first conducting plate and the second conducting plate, and an end of the upper power distribution module disposed with the first power column/the second power column and an end of the lower power distribution module disposed with the first power column/the second power column are oppositely disposed at a middle portion of the base.

In an embodiment of the present invention, a first cable and a second cable are further included. One end of the first cable and one end of the second cable are electrically connected to the power supply unit. The other end of the first cable is attached to the first power column of the first conducting plate. The other end of the second cable is attached to the second power column of the second conducting plate.

In an embodiment of the present invention, the server unit is inserted into an end of the rack disposed with the electrodes.

In an embodiment of the present invention, the set of the positioning posts, and the first output pin and the second output pin of the output pin pair protrude in the same direction along a horizontal axis, and a protruding direction thereof is opposite to an insertion direction of the server unit in the rack. When the set of the positioning posts on the base is correspondingly inserted into the set of the positioning holes in the server unit, the output pin pair matching the set of the positioning posts is respectively electrically connected to the pair of electrodes of the server unit to transfer electric power to the server unit.

To sum up, in the embodiments of the present invention, the server enables the server unit to be automatically connected to the corresponding pins after being assembled in the rack through a distribution or transmission unit in the rack which includes a pair of conducting plates and a plurality of pins arranged in an array, so as to facilitate the electric power provided by the power supply unit to be automatically transferred to the server unit through the transmission unit. In this way, undesirable space utilization and messy cable configurations that impede service and maintenance of the server can be avoided. A simpler transmission structure is adopted to achieve the electrical connection effect required by the server unit.

In order to make the features and advantages of the present invention more comprehensible, the present invention is described in further detail below with reference to embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
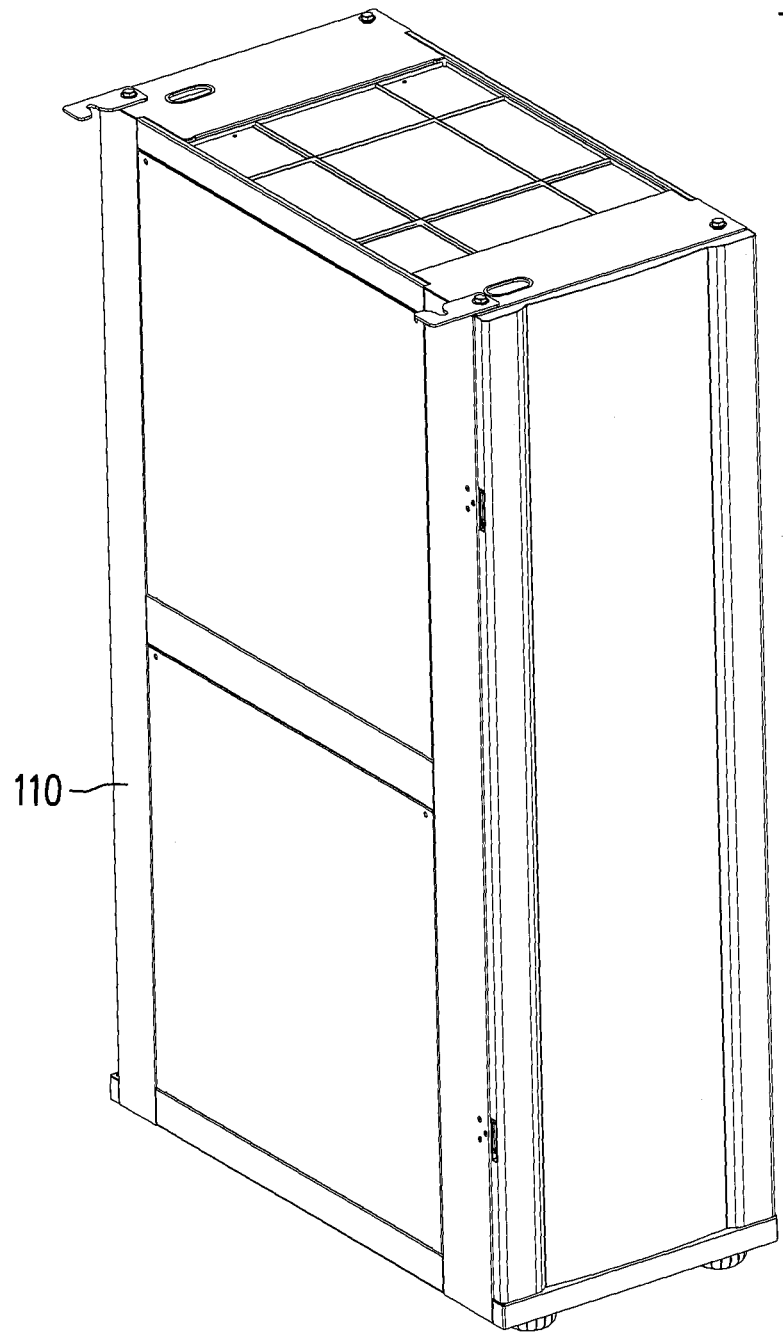
FIG. 1 is a schematic view of a server rack system according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
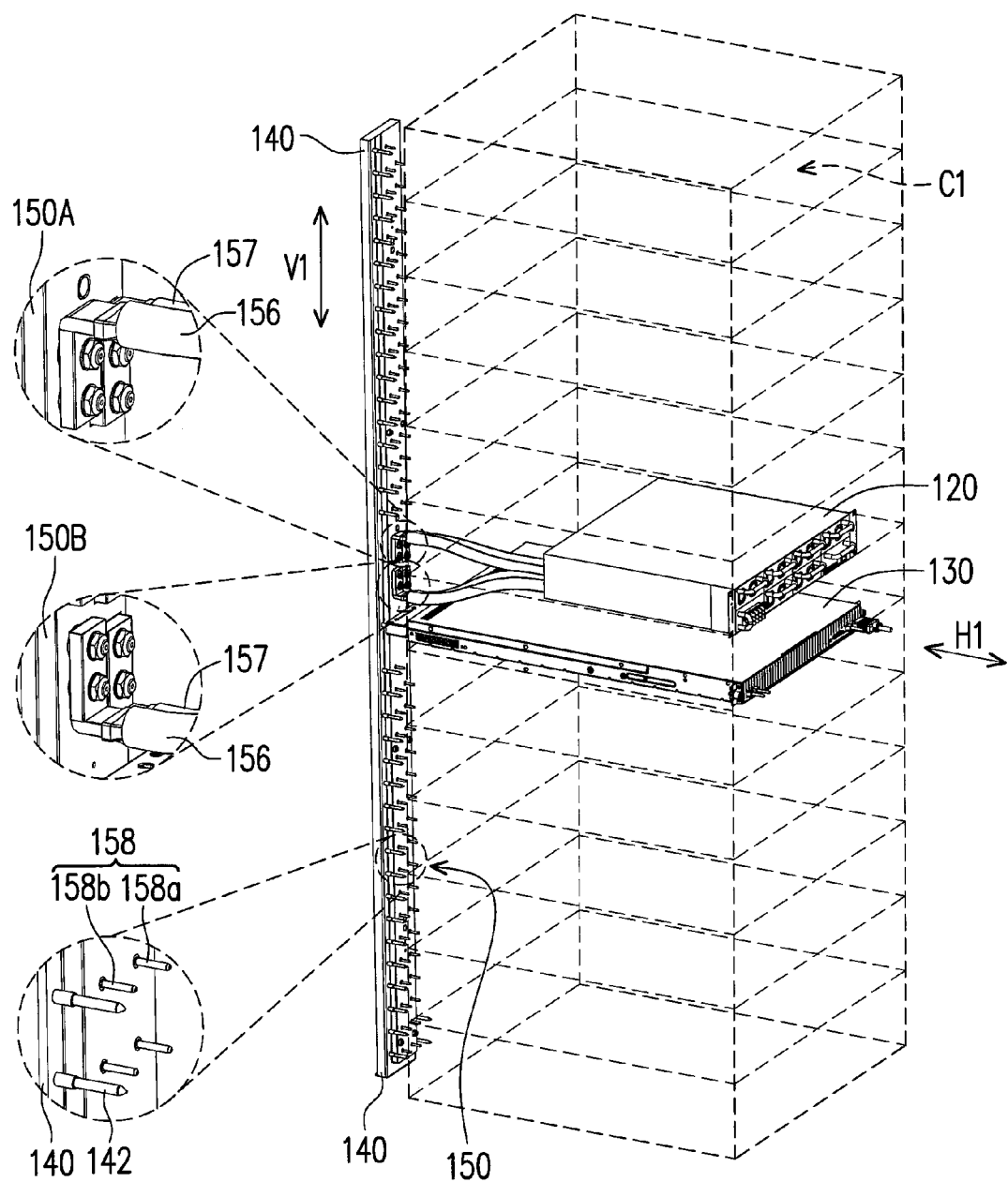
FIG. 2 is a schematic view of partial components in the server rack system in FIG. 1.

FIG. 1 is a schematic view of a server rack system according to an embodiment of the present invention, and FIG. 2 is a schematic view of partial components in the server rack system in FIG. 1. FIG. 2 merely shows partial components in the inner space of a rack, and clearly illustrates a corresponding relation between the components. Referring to FIG. 1 and FIG. 2 at the same time, in this embodiment, a server rack system 100 includes a rack 110, a power supply unit 120, a plurality of server units 130, a vertically oriented base or power distribution strip support bracket 140, and a power distribution module 150. The rack 110 has a plurality of shelving spaces C1, and the power supply unit 120 and the server unit 130 are respectively inserted in a sliding manner in the shelving spaces C1 along a horizontal axis H1; that is, the server unit 130 and the power supply unit 120 are respectively disposed in one of the shelving spaces C1 at a middle portion of the rack 110. Here, only one server unit 130 and one power supply unit 120 are illustrated, but this embodiment is not limited thereto. In addition, the server unit 130 may also include a network switch control unit or other relevant electronic apparatuses applicable to the server system, and the server unit 130 is merely used as a representative herein.

It should be noted that the base 140 is preferably electrically neutral (e.g., electrically grounded or electrically non-conducting), is assembled between a top portion and a bottom portion of the rack 110 along a vertical axis V1, and passes through the shelving spaces C1. The power distribution module 150 is disposed between the top portion and the bottom portion of the rack 110 along the vertical axis V1, and is electrically connected between the power supply unit 120 and the server unit 130 to transfer electric power there-between. In other words, after the server unit 130 (or other electronic apparatuses) is inserted into the shelving space C1 along the horizontal axis H1, the power distribution module 150 is electrically connected between the server unit 130 (or other electronic apparatuses) and the power supply unit 120, so as to transfer electric power generated by the power supply unit 120 to the server unit 130 through the power distribution module 150, and enable the server unit 130 to obtain the electric power for operation.

To sum up, the server rack system 100 of the present invention enables the server unit 130 to be electrically connected to the power distribution module 150 after being assembled in the shelving space C1 of the rack 110 through the power distribution module 150 in the rack 110, so as to obtain electric power from the power supply unit 120. In this way, in comparison with the prior art, in the server rack system 100 of the present invention, the cables connecting between the power supply unit 120 and the server units 130 are omitted, so that a simple layout exists in the rack 110, and the space utilization of the rack 110 is also improved accordingly, thereby preventing too many cables in the rack 110 from affecting normal operation of the server rack system 100 by the user.

Figure 3:
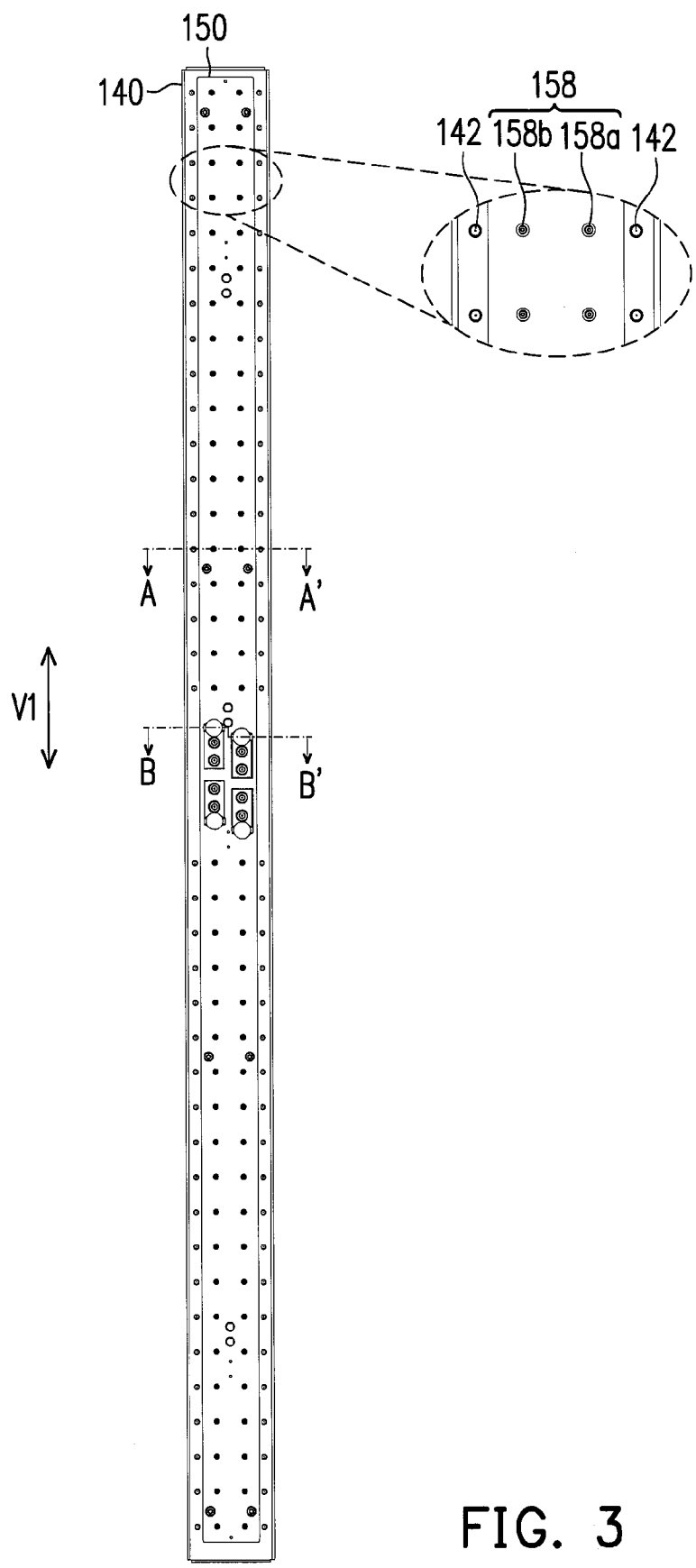
FIG. 3 is a schematic view of a power distribution module in the server rack system in FIG. 2.
Figure 4:
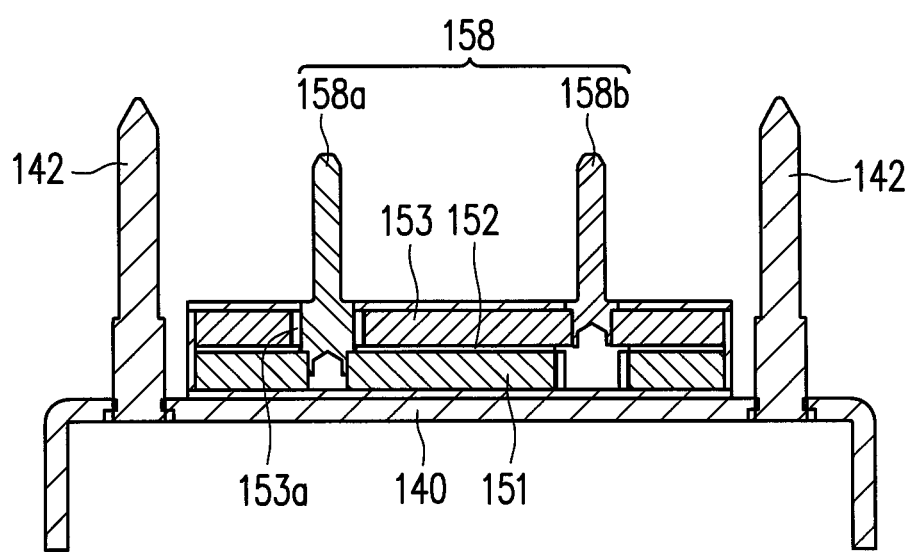
FIG. 4 is a sectional view of the power distribution module along A-A' in FIG. 3.
Figure 5:
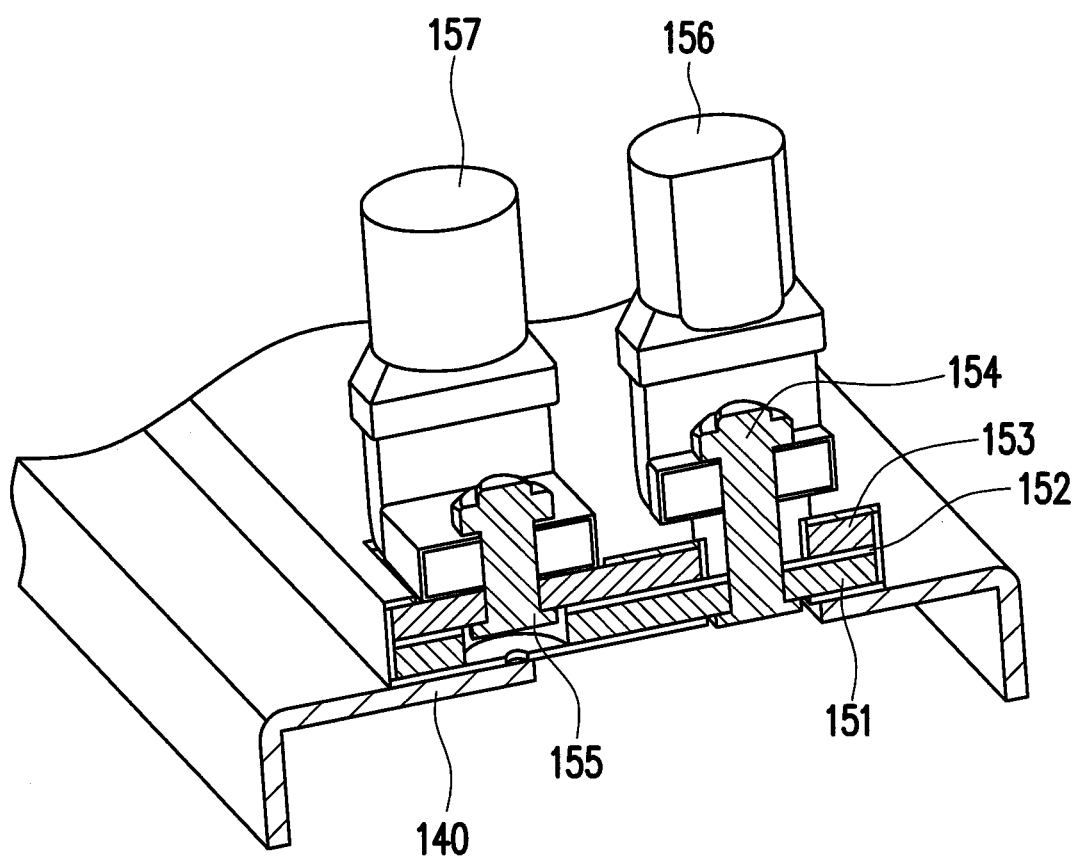
FIG. 5 is a sectional view of the power distribution module along B-B' in FIG. 3.

FIG. 3 is a schematic view of the power distribution module in the server rack system in FIG. 2, FIG. 4 is a sectional view of the power distribution module along A-A' in FIG. 3, and FIG. 5 is a sectional view of the power distribution module along B-B' in FIG. 3. Referring to FIG. 2 to FIG. 5, in this embodiment, the power distribution module 150 includes a first conducting plate 151, an insulation layer 152 and a second conducting plate 153 that are sequentially superimposed on the base 140, in which the insulation layer 152 is disposed between the first conducting plate 151 and the second conducting plate 153. The power distribution module 150 further includes a first power column 154 inserted in the first conducting plate 151 and a second power column 155 inserted in the second conducting plate 153, in which the first power column 154 and the second power column 155 are connected to the power supply unit 120 in the rack 110 through a first cable 156 and a second cable 157, so as to obtain electric power therefrom.

In other words, one end of the first cable 156 and one end of the second cable 157 are electrically connected to the power supply unit 120, the other end of the first cable 156 is attached to the first power column 154 on the first conducting plate 151, and the other end of the second cable 157 is attached to the second power column 155 on the second conducting plate 153.

In addition, the power distribution module 150 further includes a plurality of output pin pairs 158, and the output pin pairs 158 protrude towards the shelving space C1. On the other hand, each output pin pair 158 includes a first output pin 158a inserted in the first conducting plate 151 and a second output pin 158b inserted in the second conducting plate 153. Each output pin pair 158 is connected to a corresponding server unit 130 in the rack 110, so as to transfer electric power to the server unit 130.

Further, in this embodiment, the first output pin 158a of each output pin pair 158 passes through the insulation layer 152 and the second conducting plate 153, and protrudes out of the second conducting plate 153 in the same direction with the second output pin 158b. Moreover, in order to avoid an electrical connection between the first conducting plate 151 and the second conducting plate 153, a surface of the first conducting plate 151 and a surface of the second conducting plate 153 are both covered with an insulation material, and a ring-shaped insulator 153a surrounding the first output pin 158a is disposed in the second conducting plate 153, so as to achieve the effect of isolating the first output pin 158a from the second conducting plate 153.

In addition, referring to FIG. 2, in the power distribution module 150 of this embodiment, an upper half portion of the base 140 is superimposed with an upper power distribution module 150A, and a lower half portion thereof is superimposed with a lower power distribution module 150B, in which the upper power distribution module 150A and the lower power distribution module 150B are independently disposed, and are both superimposed on the same surface of the base 140 along the vertical axis V1. A first power column 154 and a second power column 155 of the upper power distribution module 150A are respectively disposed on the same end of the first conducting plate 151 and the second conducting plate 153. A first power column 154 and a second power column 155 of the lower power distribution module 150B are respectively disposed on the same end of the first conducting plate 151 and the second conducting plate 153. An end of the upper power distribution module 150A disposed with the first power column 154 and the second power column 155 and an end of the lower power distribution module 150B disposed with the first power column 154 and the second power column 155 are oppositely disposed at a middle portion of the base 140.

Figure 6:
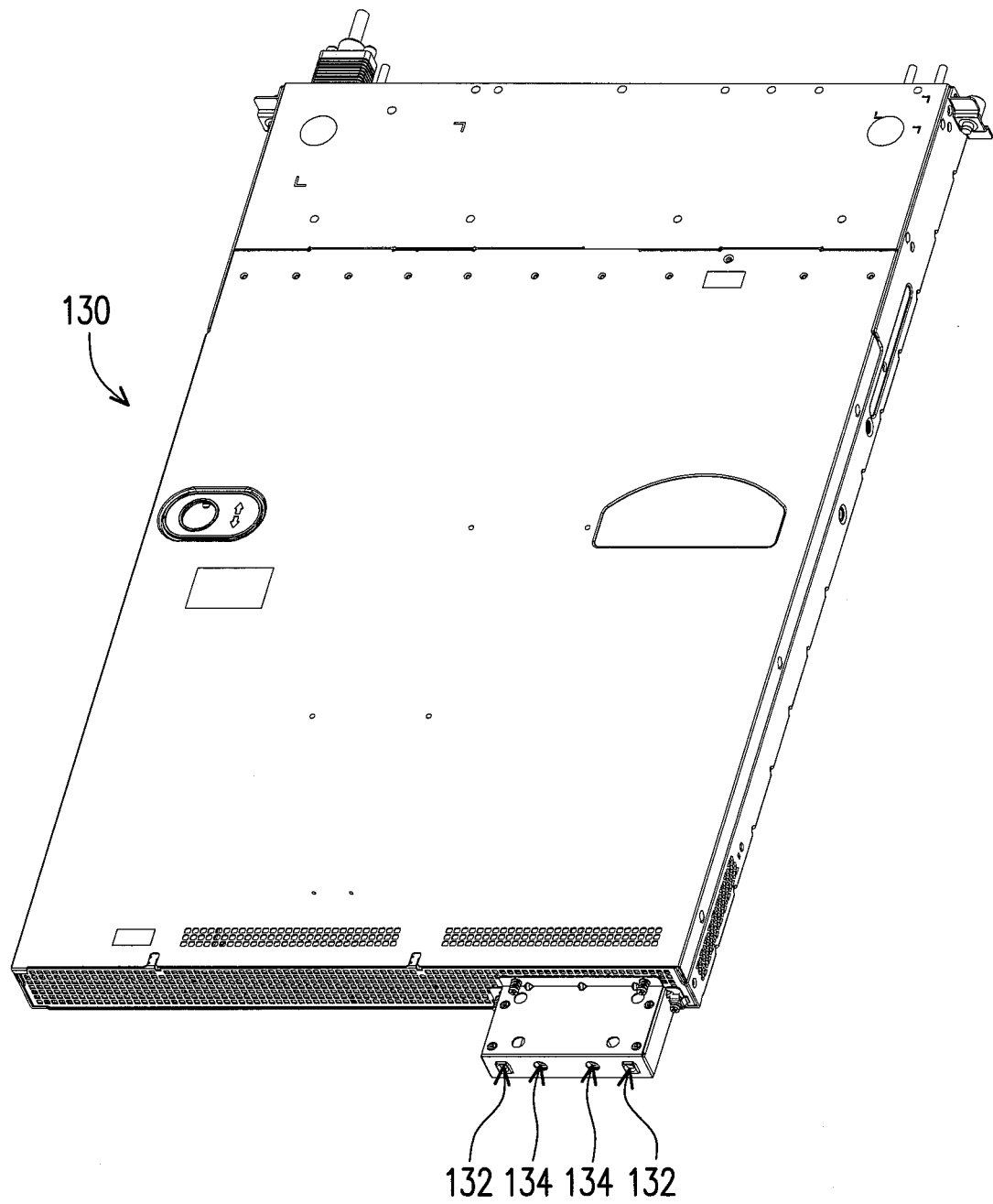
FIG. 6 is a schematic view of a server unit in the server rack system at opposite viewing angles in FIG. 2.

In addition, FIG. 6 is a schematic view of the server unit in the server rack system at a viewing angle opposite of that shown in FIG. 2. Referring to FIG. 2 to FIG. 6, in this embodiment, multiple sets of electrically neutral (e.g., either non-conducting or electrically grounded) positioning posts 142 are disposed on the base 140, each set of the positioning posts 142 is disposed on two opposite sides of the first output pin 158a and the second output pin 158b of one of the output pin pairs 158, and a distal end of each of the positioning posts 142 protrudes farther than a distal end of each of the output pins 158.

Each set of the positioning posts 142 is disposed matching the output pin pair 158 protruding from the first conducting plate 151 and the second conducting plate 153. Correspondingly, an end of the server unit 130 inserted into the rack 110 is disposed with one set of positioning holes 132 and one pair of electrodes 134. Moreover, at least one set of the positioning posts 142 and the corresponding output pin pair 158 in the rack 110 are provided for each shelving space C1 of the rack 110. Therefore, as a server unit 130 is inserted into the shelving space C1, a set of the positioning posts 142 is correspondingly aligned with and begins to be inserted into a set of the positioning holes 132 on the server unit 130 before the output pin pair 158 makes electrical contact with the electrodes 134 of the server unit 130. In this manner, the positioning posts 142 first serves to prevent an electrical misconnections, and secondly serves to guide the output pin pair 158 into electrical contact with the electrodes 134, so as to transfer electrical power from the power supply unit 120 to the server unit 130.

In other words, the set of the positioning posts 142, and the first output pin 158a and the second output pin 158b of the output pin pair 158 protrude in the same direction along the horizontal axis H1, and a protruding direction thereof is opposite to an insertion direction of the server unit 130 in the rack 110. Therefore, when the positioning posts 142 on the base 140 are correspondingly inserted into the positioning holes 134 on the server unit 130, the output pin pair 158 matching the positioning posts 142 is respectively electrically connected to the electrodes 134 of the server unit 130, so as to transfer electric power to the server unit 130.

Figure 7:
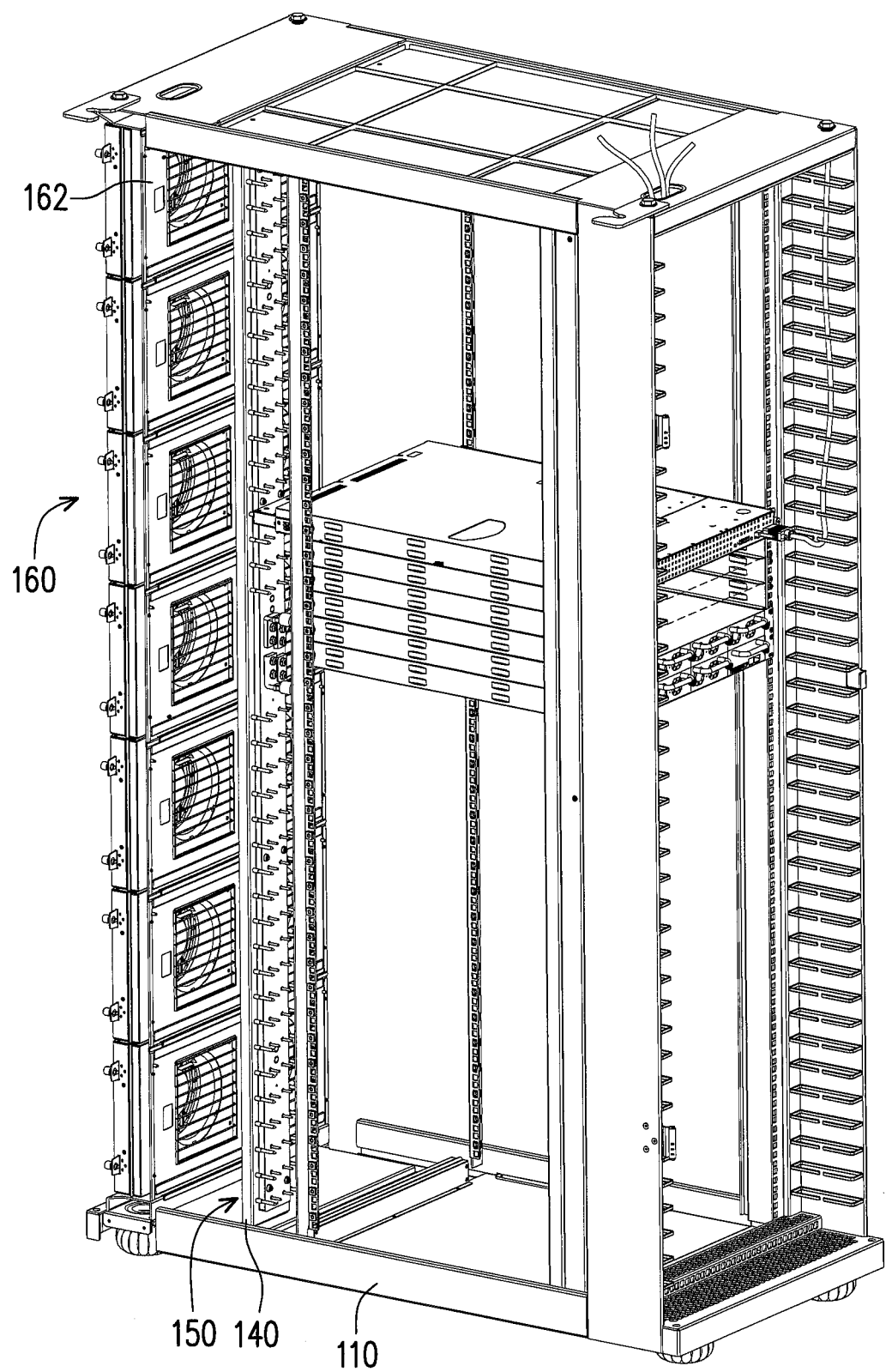
FIG. 7 is a schematic view of partial components in the server rack system in FIG. 1.
Figure 8:
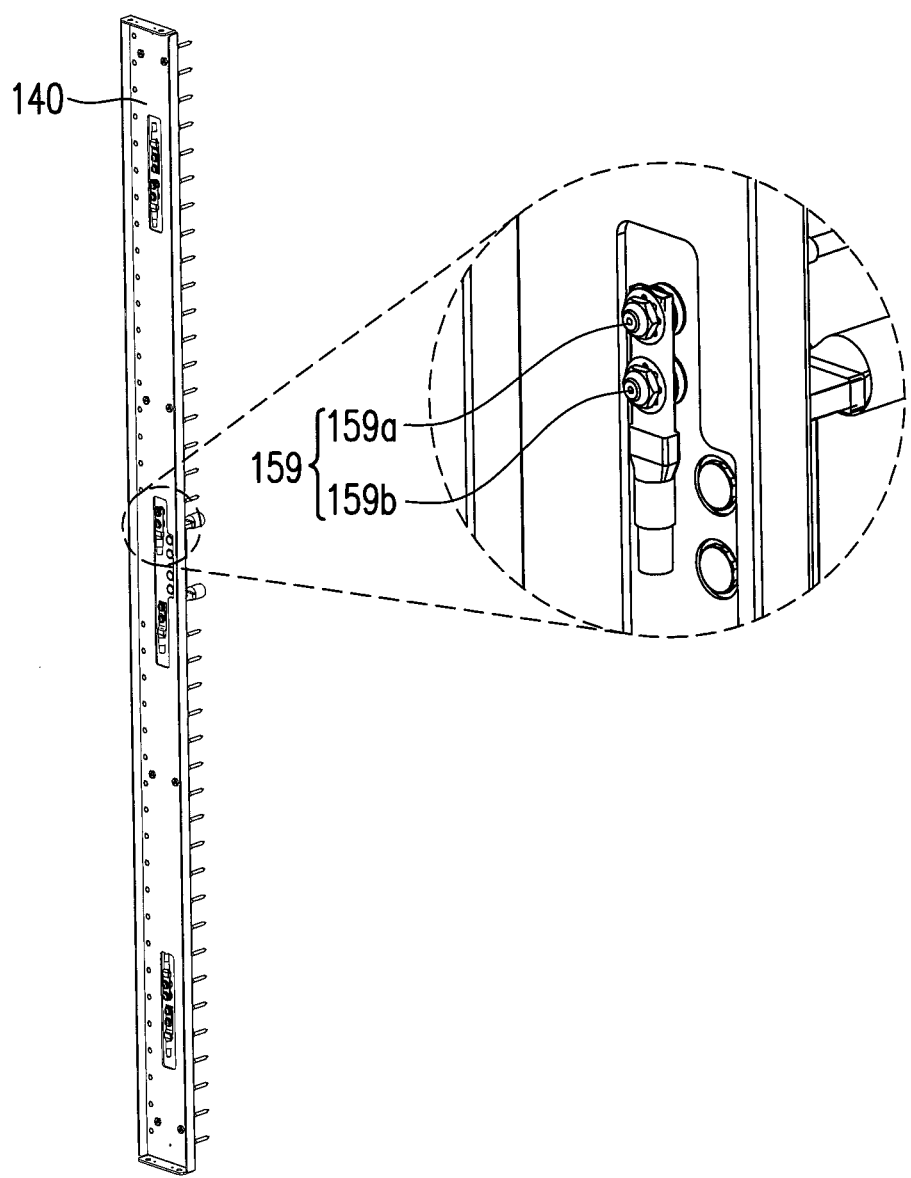
FIG. 8 is a schematic view of the power distribution module at opposite viewing angles in FIG. 2.

FIG. 7 is a schematic view of partial components of another embodiment of the server rack system of FIG. 1, and FIG. 8 is a schematic view of the power distribution module at a viewing angle opposite of that of FIG. 2. Referring to FIG. 7 and FIG. 8, in this embodiment, the server rack system 100 further includes a fan wall 160 disposed at a back wall of the rack 110 and formed by a plurality of fan units 162. The base 140 and the power distribution module 150 are disposed between the fan wall 160 and the shelving space C1.

In addition, the power distribution module 150 further includes a plurality of fan pin pairs 159. Each fan pin pair 159 includes a first fan pin 159a inserted in the first conducting plate 151 (both are electrically connected) and a second fan pin 159b inserted in the second conducting plate 153 (both are electrically connected). The first fan pin 159a and the second fan pin 159b both protrude via through holes on the base 140, and a protruding direction thereof is the same as an insertion direction of the server unit 130 in the rack 110 (towards the back wall of the rack 110). The fan pin pairs 159 are connected to the fan units 162, to transfer electric power to the fan units 162. The first fan pin 159a and the second fan pin 159b of each fan pin pair 159 both protrude in a direction opposite to the first output pin 158a and the second output pin 158b of each output pin pair 158.

To sum up, in the embodiments of the present invention, the server enables the server unit to be automatically connected to the corresponding pins after being assembled in the rack through an electrical power transmission unit in the rack which includes a pair of conducting plates and a plurality of pins arranged in an array, so as to facilitate the distribution of electrical power from the power supply to the server units. In this way, undesirable space utilization and messy cable configurations that obstruct or impede servicing can be avoided. In short, a simpler transmission structure is adopted to achieve the electrical connection effect required by the server unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power distribution device, applicable to a server rack system, wherein the server rack system comprises a rack and at least one apparatus disposed therein, and the power distribution device is used for supplying electric power to the apparatus, the power distribution device comprising:

a first conducting plate, an insulation layer and a second conducting plate that are sequentially superimposed, wherein the insulation layer is disposed between the first conducting plate and the second conducting plate;

a first power column inserted in the first conducting plate and a second power column inserted in the second conducting plate, wherein the first power column and the second power column are connected to a power supply unit in the rack to obtain electric power therefrom;

a plurality of output pin pairs, wherein each output pin pair comprises a first output pin inserted in the first conducting plate and a second output pin inserted in the second conducting plate, and the plurality of output pin pairs is connected to the apparatus in the rack to transfer electric power to the apparatus by way of the first conducting plate and the second conducting plate; and a plurality of fan pin pairs, wherein each fan pin pair comprises a first fan pin inserted in the first conducting plate and a second fan pin inserted in the second conducting plate, the plurality of fan pin pairs being operable to be connected to a fan unit in the rack to transfer electric power to the fan unit, and the first fan pin and the second fan pin of each fan pin pair both protrude in a direction opposite to the first output pin and the second output pin of each output pin pair.

2. The power distribution device according to claim 1, wherein the first output pin of one of the output pin pairs passes through the insulation :layer and the second conducting plate, and protrudes out of the second conducting plate in the same direction with the second output pin of the output pin pair, wherein a ring-shaped insulator surrounding the first output pin is disposed in the second conducting plate, and the ring-shaped insulator is used for isolating the first output pin from the second conducting plate.

3. The power distribution device according to claim 1, further comprising:

a base, wherein a surface of the first conducting plate opposite to the insulation layer is superimposed on the base, and the base is disposed between a top portion and a bottom portion of the rack along a vertical axis.

4. The power distribution device according to claim 3, wherein multiple sets of positioning posts are disposed on the base, each set of the positioning posts is disposed matching the output pin pair protruding from the first conducting plate and the second conducting plate, wherein when the set of the positioning posts is correspondingly inserted into a set of positioning holes on the apparatus, the output pin pair is respectively electrically connected to a pair of electrodes of the apparatus to transfer electric power to the apparatus.

5. The power distribution device according to claim 4, wherein each set of positioning posts comprises two positioning posts respectively disposed on opposite sides of the first and second output pins, wherein the set of the positioning posts protrude in the same direction along a horizontal axis of the rack as the first and second output pins, and distal ends of the positioning posts protrude farther than the distal ends of the output pin pair.

6. A server rack system, comprising:

a rack, comprising a plurality of shelving spaces for receiving a power supply unit and at least one server unit inserted in a sliding manner along a horizontal axis;

a power distribution module support base, disposed between a top portion and a bottom portion of the rack along a vertical axis; and a power distribution module, superimposed on a surface of the base along the vertical axis so as to transfer electrical power between the power supply unit and the server unit, and comprising:
- a first conducting plate, an insulation layer and a second conducting plate that are sequentially superimposed on the power distribution module support base, wherein the insulation layer is disposed between the first conducting plate and the second conducting plate;
- a first power column inserted in the first conducting plate and a second power column inserted in the second conducting plate, wherein the first power column and the second power column are connected to the power supply unit in the rack to obtain electric power therefrom;
- a plurality of output pin pairs, wherein, each output pin pair comprises a first output pin inserted in the first conducting plate and a second output pin inserted in the second conducting plate, and the plurality of output pin pairs is connected to the server unit in the rack to transfer electric power to the server unit by way of the first conducting plate and the second conducting plate; and
- a fan wall disposed on a back wall of the rack and formed by a plurality of fan units, wherein the power distribution module support base and the power distribution module are disposed between the fan wall and the shelving spaces, and the output pin pairs protrude towards the shelving spaces, wherein the power distribution module further comprises:
- a plurality of fan pin pairs, wherein each fan pin pair comprises a first fan pin inserted in the first conducting plate and a second fan pin inserted in the second conduction plate, the first fan pin and the second fan pin both protrude via through holes on the base and a protruding direction thereof is the same as an insertion direction of the server unit in the rack, the plurality of a fan pin pairs is connected to the fan units to transfer electric power to the fan units, and the first fan pin and the second fan pin of each fan pin pair both protrude in a direction opposite to the first output pin and the second output pin of each output pin pair.

7. The server rack system according to claim 6, wherein the first output pin of one of the output pin pairs passes through the insulation :layer and the second conducting plate, and protrudes out of the second conducting plate in the same direction with the second output pin of the output pin pair, wherein a ring-shaped insulator surrounding the first output pin is disposed in the second conducting plate, and the ring-shaped insulator is used for isolating the first output pin from the second conducting plate.

8. The server rack system according to claim 6, wherein multiple sets of positioning posts are disposed on the base, each set of the positioning posts corresponding to and similarly positioned with respect to the output pin pair protruding from the first conducting plate and the second conducting plate;

wherein when the set of the positioning posts are inserted into a set of corresponding positioning holes on the server unit, the output pin pair is respectively electrically connected to a pair of electrodes of the server unit to transfer electric power to the server unit, wherein at least one set of the positioning posts and the corresponding output pin pair are disposed for each one shelving space in the rack.

9. The server rack system according to claim 6 wherein an upper half portion of the power distribution module support base is superimposed with an upper power distribution module and a lower half portion thereof is superimposed with a lower power distribution module, and the upper power distribution module and the lower power distribution module are independently disposed and are superimposed on the same surface of the power distribution module support base along the vertical axis.

10. The server rack system according to claim 9, wherein a first power column and a second power column of the upper power distribution module are respectively disposed on the same end of the first conducting plate and the second conducting plate, a first power column and a second power column of the lower power distribution module are respectively disposed on the same end of the first conducting plate and the second conducting plate, and the end of the upper power distribution module disposed with the first and second power columns and the end of the lower power distribution module disposed with the first and second power columns are oppositely disposed at a middle portion of the power distribution module support base.

11. The server rack system according to claim 6, further comprising:
- a first cable and a second cable, wherein one end of the first cable and one end of the second cable are electrically connected to the power supply unit, the other end of the first cable is attached to the first power column on the first conducting plate, and the other end of the second cable is attached to the second power column on the second conducting plate.

12. The server rack system according to claim 8, wherein an end of the server unit inserted into the rack is disposed with the pair of electrodes, wherein the set of the positioning posts, and the first output pin and the second output pin of the output pin pair protrude in the same direction along the horizontal axis and a protruding direction thereof is opposite to an insertion direction of the server unit in the rack, and when the set of the positioning posts on the base is correspondingly inserted into the set of positioning holes on the server unit, the output pin pair matching the set of the positioning posts is respectively electrically connected to the pair of electrodes of the server unit to transfer electric power to the server unit.

* * * * *